United States Patent [19]
Maier et al.

[11] Patent Number: 5,966,008
[45] Date of Patent: Oct. 12, 1999

[54] RADIO-INTERROGATED, SURFACE-WAVE TECHNOLOGY CURRENT TRANSFORMER FOR HIGH-VOLTAGE SYSTEMS

[75] Inventors: Reinhard Maier, Herzogenaurach; Wolf-Eckhart Bulst, München; Thomas Ostertag, Ulm; Oliver Sczesny, Aschheim; Wolfgang Schelter, Uttenreuth; Leonhard Reindl, Stephanskirchen; Werner Ruile, München; Gerd Scholl, München; Jürgen Michel, München, all of Germany

[73] Assignee: Siemens Aktiengesellschaft, Munich, Germany

[21] Appl. No.: 08/953,965

[22] Filed: Oct. 20, 1997

Related U.S. Application Data

[63] Continuation of application No. PCT/DE96/00664, Apr. 16, 1996.

[30] Foreign Application Priority Data

Apr. 18, 1995 [DE] Germany ............... 195 14 342

[51] Int. Cl.⁶ ............... G01R 15/20; G01R 33/00; G01R 31/00; G01R 33/02
[52] U.S. Cl. ............... 324/96; 324/117 R; 324/252; 324/226
[58] Field of Search ............... 324/96, 117 B, 324/117 H, 127, 226, 252; 340/870.3, 870.16, 825.54, 664; 310/313 R, 313 B

[56] References Cited

U.S. PATENT DOCUMENTS

| | | |
|---|---|---|
| 3,273,146 | 9/1966 | Hurwitz et al. |
| 4,420,752 | 12/1983 | Davis et al. |
| 4,620,191 | 10/1986 | Skeie. |
| 4,725,841 | 2/1988 | Nysen et al. |

FOREIGN PATENT DOCUMENTS

| | | |
|---|---|---|
| 0 166 065 A1 | 1/1986 | European Pat. Off. |
| 0 465 029 A2 | 1/1992 | European Pat. Off. |
| 7222482 | 2/1973 | Germany. |
| 3828 005 A1 | 3/1989 | Germany. |
| 519723 | 4/1972 | Switzerland. |
| 93/00252 | 1/1993 | WIPO. |
| 93/13495 | 7/1993 | WIPO. |

OTHER PUBLICATIONS

"Surface–Acoustic–Wave Pressure and Temperature Sensors" (Reeder et al.), Proceedings of the IEEE, vol. 64, No. 5, May 1976 pp. 754–756;.

"Surface–Acoustic–Wave Device Incorporating Conducting Langmuir–Blodgett Films", Electronic Letters, vol. 23, No. 9, Apr. 23, 1987;.

*Primary Examiner*—Walter E. Snow
*Attorney, Agent, or Firm*—Herbert L. Lerner; Laurence A. Greenberg

[57] ABSTRACT

A radio-interrogated, surface-wave technology current transformer for high/medium-voltage systems includes a magnetosensitive element connected to a surface-wave structure of a surface-wave configuration as a termination of the surface-wave structure. A response signal of the surface-wave configuration is information regarding current strength/direction and phase of the current instantaneously flowing through the system, which is evaluated by a ground station. By virtue of the radio transmission, there is no electrical insulation problem, and the use of a radio-interrogated surface-wave configuration makes that part of the overall current transducer which is at high potential into a passive element of the same.

18 Claims, 10 Drawing Sheets

FIG 10

RADIO-INTERROGATED, SURFACE-WAVE TECHNOLOGY CURRENT TRANSFORMER FOR HIGH-VOLTAGE SYSTEMS

CROSS-REFERENCE TO RELATED APPLICATION

This application is a continuation of International Application Ser. No. PCT/DE96/00664, filed Apr. 16, 1996.

BACKGROUND OF THE INVENTION

Field of the Invention

The invention relates to a current transformer which is used for current strength measurement on/in electrical devices that are at high/medium voltage, such as, for example, overhead power transmission lines, cables, substations, transformers and the like.

A current transformer with which the invention is concerned is constructed with surface-wave technology, that is to say it has as its essential component an electroacoustic surface-wave configuration with surface-wave structures.

Surface-wave configurations relevant to the invention are disclosed by Published International Patent Applications WO 93/13495 and WO/CH93/00252 and U.S. Pat. Nos. 3,273,146; 4,725,841 and 4,620,191. The cited applications and patents describe methods of building and operating various surface-wave configurations, all of which have the common factor that, through the use of an interdigital transducer, surface waves are produced in a piezoelectric substrate body from an electrical signal, and those surface waves as a rule propagate essentially perpendicularly to the interdigital alignment of the transducer electrodes at the surface of the substrate body. It is possible to recover a characteristically altered radiofrequency signal from the surface wave with a second interdigital transducer, which may even be the transducer already described above, in double-mode operation. As described in the prior art, such a surface-wave configuration may include even further structures such as reflector structures, further transducer structures, etc. which, for example, may also have a dispersive configuration of reflector/transducer fingers, an encoded configuration of fingers, and the like.

An essential aspect and subject of the present invention is that the current transformer has a radio-interrogated sensor part made by using surface-wave technology, which is passive, that is to say it requires no (DC) power supply, and to which a radiofrequency signal, for example a burst pulse, an FM-CW signal, a chirped pulse and the like, is transmitted from a remote radiofrequency transmitter. For that purpose, the surface-wave configuration of the sensor part, that is to say its input transducer structure, is equipped with an antenna for radio reception of that transmitted pulse. A corresponding antenna, which is connected to a second transducer structure of the surface-wave configuration, or, in the case already mentioned of a transducer structure with double-mode operation, is the same antenna, is used to transmit back the impulse-response signal of the surface-wave configuration, which is to be received in a remote receiver. The impulse-response signal that is transmitted back as a rule is different from the signal received by the surface-wave configuration, namely according to the current-strength measured value to be determined, and that is actually because of corresponding physical action on the surface-wave configuration.

Radio-interrogated surface-wave configurations are already used, for example in toll systems on roads, in road tunnels and the like, but in that case the detection of preprogrammed individual encoding of the impulse-response signal for object identification is involved. Radio-interrogated surface-wave configurations have also been used in metrology. Those configurations as a rule are constructed as delay lines, and measures are taken for the purpose of measurement in such a way that the measured quantity to be determined in the surface-wave configuration causes a change in the propagation time of the acoustic wave. That change in propagation time may be based on an electric field (oriented transversely to the propagation direction of the surface wave) in the substrate body, with that field producing, for example by piezoelectric effect, a change in propagation time in the corresponding partial region of the substrate body (Published European Patent Application 0 166 065 A1). By way of example, a temperature sensor using a change in the wave propagation time is known (Published European Patent Application 0 465 029 A1, corresponding to U.S. Pat. No. 5,286,109). A configuration which exploits an impedance change of an organic layer applied on the surface of the substrate body of the surface-wave configuration is suitable for measuring surface loading of that layer, for example with a chemical substance to be identified/quantitatively measured (Electronics Letters, Vol. 23 (1987) No. 9 pp. 446/447). A relevant pressure meter is also known, in which the mechanical property of the body, for example flexion, altered as a function of pressure in the material of the substrate body of the surface-wave configuration, causes a change in the propagation time of the acoustic wave and renders it usable for determining the measured value (Proceedings IEEE, Vol. 64, (1976) pp. 754–6). However, in the case of the configurations last mentioned herein, a remote interrogation by radio is not provided. Magnetosensitive sensors per se are likewise known in a different context, for example from German Published, Non-Prosecuted, Patent Application 38 28 005 and from a paper entitled "Magneto-Resistive Sensoren, Grundlagen . . ." [Magnetoresistive Sensors, Fundamentals . . ."] in Proceedings of the Symposium of Jun. 25, 1992, Dortmund, Dienstleistungszentrum MIOK, Institute for Applied Physics, University of Jena.

SUMMARY OF THE INVENTION

It is accordingly an object of the invention to provide a radio-interrogated, surface-wave technology current transformer for high-voltage systems, which overcomes the hereinafore-mentioned disadvantages of the heretofore-known devices of this general type and which provides a new field of application for a radio-interrogated, remote-interrogated sensor device with a surface-wave configuration which is also configured in a manner particularly matched to the selected field of application. From the point of view of an engineer in power engineering and, in particular, (electrical) power distribution, the object of the invention is to provide an advantageous current transformer for measuring (the strength and phase of) currents in devices which are at high voltage.

With the foregoing and other objects in view there is provided, in accordance with the invention, a current transformer for current strength measurement on/in electrical devices at high voltage/medium voltage, comprising a surface-wave configuration having surface-wave structures and at least one antenna; at least one magnetosensitive element which is to be exposed to the magnetic field of the current to be measured being coupled to at least one of the surface-wave structures; and a radiofrequency transmitter and receiver having a radio antenna and an electronic evaluation device, the transmitter constructed for radio transmission of an interrogation pulse and the receiver with the evaluation device constructed for radio reception and for evaluation of a change influenced by an instantaneous magnetic field in a high-voltage device, the change occurring in an impulse response of the surface-wave configuration.

The invention makes it possible to provide a floating measurement with an earth or ground evaluation unit in high-voltage/medium-voltage systems in a simple manner. In particular, the device according to the invention is very insensitive to interference, requires no maintenance and has a long working life. The device sensor component which is at high-voltage potential has only a small overall size and low weight. A device according to the invention further requires no particular adjustment or other alignment of the device components which are at high-voltage potential, on one hand, and are earthed or grounded, on the other hand.

The magnetosensitive element is preferably a magnetoresistive electrical element (magnetic field-dependent impedance), which is electrically connected to at least one of the surface-wave structures of the surface-wave configuration. It is also possible to provide a layer or a support made of magnetostrictive material, which is mechanically coupled to the surface wave of the surface-wave structure by application on the upper side or lower side of the substrate body.

Other features which are considered as characteristic for the invention are set forth in the appended claims. Although the invention is illustrated and described herein as embodied in a radio-interrogated, surface-wave technology current transformer for high-voltage systems, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
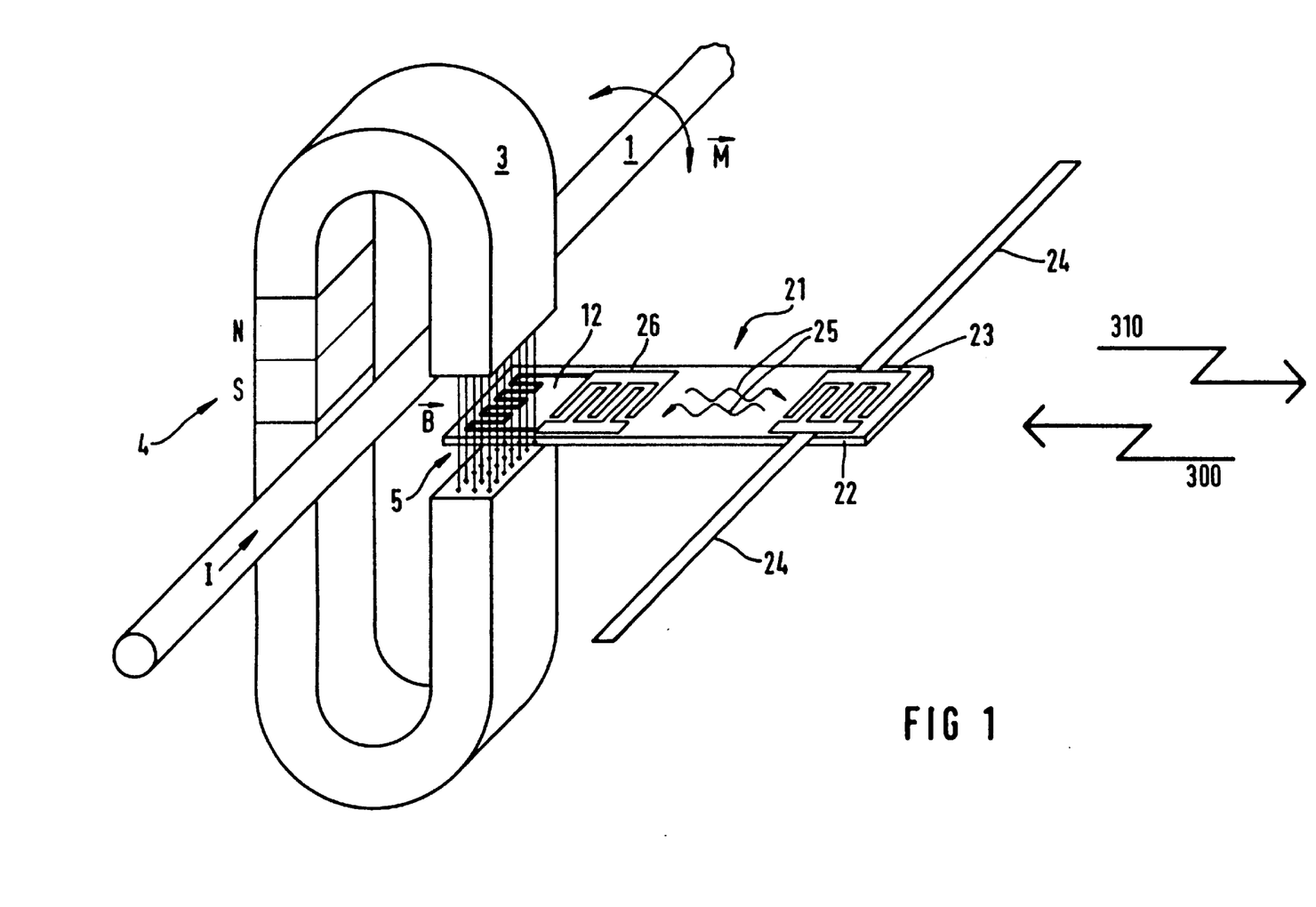
FIG. 1 is a fragmentary, diagrammatic, perspective view of a simple example of a current transformer according to the invention in an illustrative working configuration.

Referring now to the figures of the drawings in detail and first, particularly, to FIG. 1 thereof, it is seen that reference numeral 1 indicates a high-voltage power line such as is used, for example, as an overhead conductor on high-voltage pylons. When current is flowing through the line 1, an annular magnetic field M is produced around the latter, and in the case of an alternating current, this field periodically changes its sense of rotation. A soft iron ring 3 with an air gap is provided in order to obtain defined channeling of this magnetic field M in the region of a sensor according to the invention. In the case of the example shown in FIG. 1, a magnetoresistor 12 is disposed as a magnetoresistive element in an active region of this ring 3. This magnetoresistor may, for example, be a known magnetoresistor which has a magnetoresistive property.

In the case of the example shown in FIG. 1, a surface-wave configuration 21 has a structure which is very simple but can nevertheless be used for explaining the essentials of the mode of action of a surface-wave configuration used in the invention. Reference numeral 22 denotes a known piezoelectric body of the surface-wave configuration 21. An interdigital transducer structure 23 is disposed in a known manner on one surface of the body 22. Reference numeral 24 denotes an antenna formed of two dipole halves. However, other relevant antenna structures such as, for example, a patch antenna, loop antenna or the like may also be provided. A radiofrequency interrogation signal 300 is received by this antenna 24 and a radio-frequency electrical voltage produced between the two dipoles supplies two interdigital finger structures of the transducer 23. A surface wave produced with the transducer 23 as an input transducer propagates on/in the surface of the substrate body 22 as is diagrammatically indicated by reference numeral 25. As it propagates, the wave 25 also enters an active region of a structure 26, which acts as a reflector for the wave 25 because of its fingers. However, since the structure 26 is (likewise) constructed as an interdigital finger structure and, as can be seen from FIG. 1, the magnetoresistive element 12 is electrically connected to its two interdigital structures, a radiofrequency electrical voltage, for which the magnetoresistive element 12 acts as an electrical terminating impedance, is also additionally produced in the structure 26 by virtue of the acoustic surface wave. Since the electrical impedance of the element 12 changes as a function of the amplitude of a magnetic field B, a change in the amplitude of the magnetic field B causes a change in the electrical terminating impedance of the structure 26. However, the effect which is produced only lies between a very high terminating impedance and an almost short-circuit terminating impedance in the extreme case, actually depending on the amplitude of the magnetic field B, that is to say depending on the strength of the current which flows in the line 1 and produces this magnetic field. A favorable measurement range of the magnetic-field controlled terminating impedance can be set in each case by suitably selected dimensioning of the electrical values of the element 12. An impulse-response signal is denoted by reference numeral 310.

In other words, the element 12 thus acts as a terminating impedance, which constitutes a novel feature of the invention.

In the known P-matrix representation of a transducer, the reflection of this transducer can be expressed as follows as a function of its electrical termination:

$$P_{11}(Y_{Load}) = P_{11}(SC) + 2 \cdot$$

in which $P_{11}(SC)$ is a short-circuit reflection factor, $P_{13}$ is an electroacoustic conversion, $P_{33}$ is a transducer admittance and $Y_{load}$ is a terminating admittance.

It is expedient (in each case) to provide a narrow-band antenna in order to protect the device against various electromagnetic interferences.

In FIG. 1, a permanent magnet 4 with poles N and S is also inserted into a flux circuit of the iron core 3. This permanent magnetic field is superposed in a gap 5 on a periodic magnetic field which corresponds to the alternating current flowing in the line 1. Through the use of the permanent magnetic field, it is possible to alter the working point of the configuration in such a way that the magnetic flux in the gap 5 does not cross zero even with the heaviest current strength in the line 1, that is to say a shift in the working point is achieved. By virtue of this structure, a constantly oriented (but dependent in amplitude on the current strength) magnetic flux B can thus be obtained in the gap 5, which makes it possible at the same time to measure the flux direction of the current to be measured as well.

Figure 2:
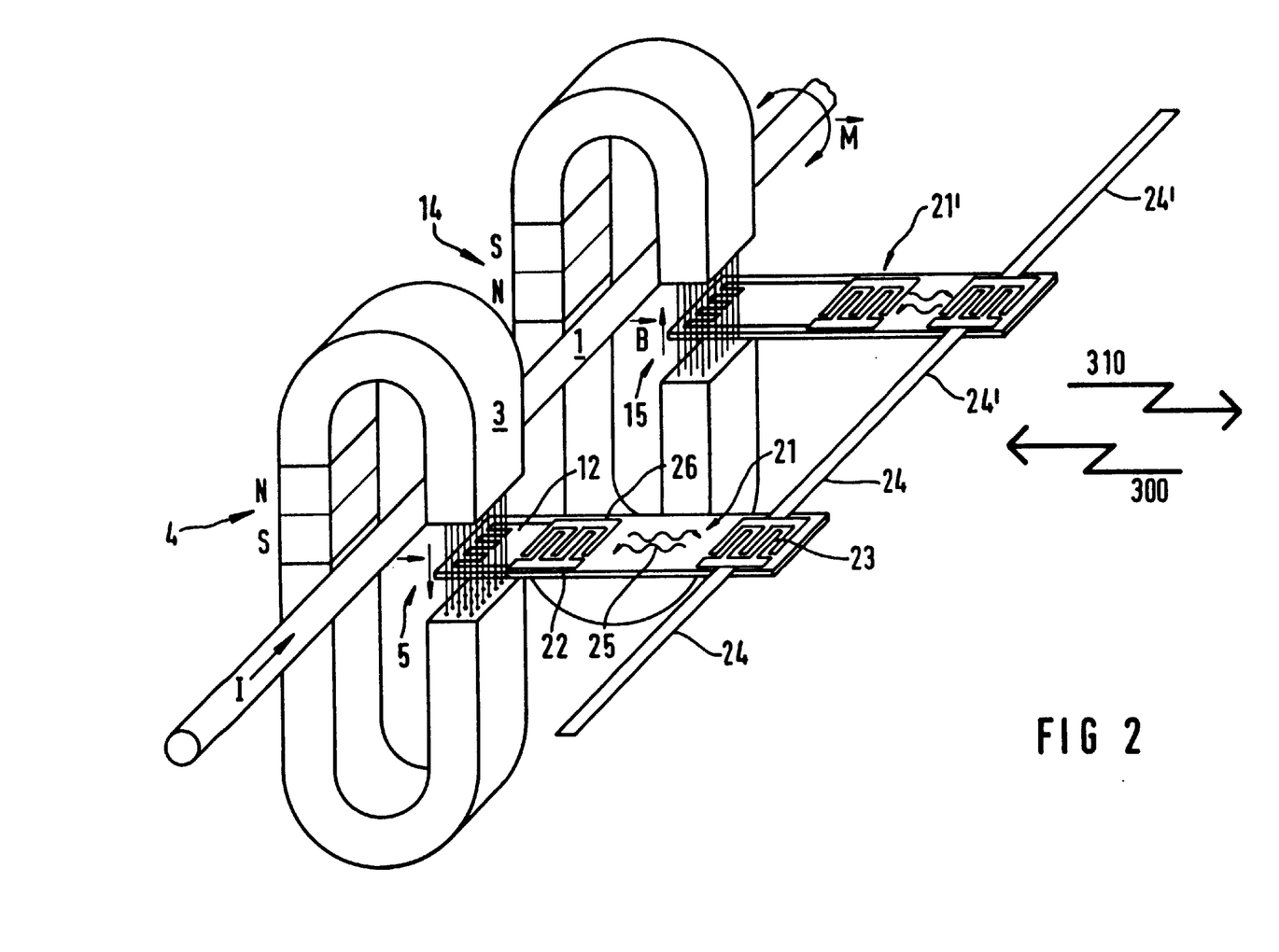
FIG. 2 is a fragmentary, perspective view of an advantageous development of an illustrative embodiment based on the example in FIG. 1.

FIG. 2 is another diagrammatic representation of a practical advantageous improvement. In FIG. 2, first and second configurations like those represented in FIG. 1 are provided on one and the same power line 1. These two configurations differ from each other in that a permanent magnet 14 of the second configuration has the opposite polarity from a permanent magnet 4 of the first configuration. The working point is thus shifted in both configurations, but in the second configuration, the flux direction B in a gap 15 is opposite to the flux direction in the gap 5. The combined evaluation of these two opposite changes of the working point shift in the region of the two magnetoresistive elements acting as terminating impedances in the two surface wave configurations 21 and 21', that is to say the measured signals with opposite phases which occur at the dipoles of the antennas 24 and 24', leads to a further improved result. The difference between the two impulse responses of the two surface-wave configurations 21 and 21' is evaluated in an evaluation instrument. The effect of this is to minimize various interfering influences.

Figure 3:
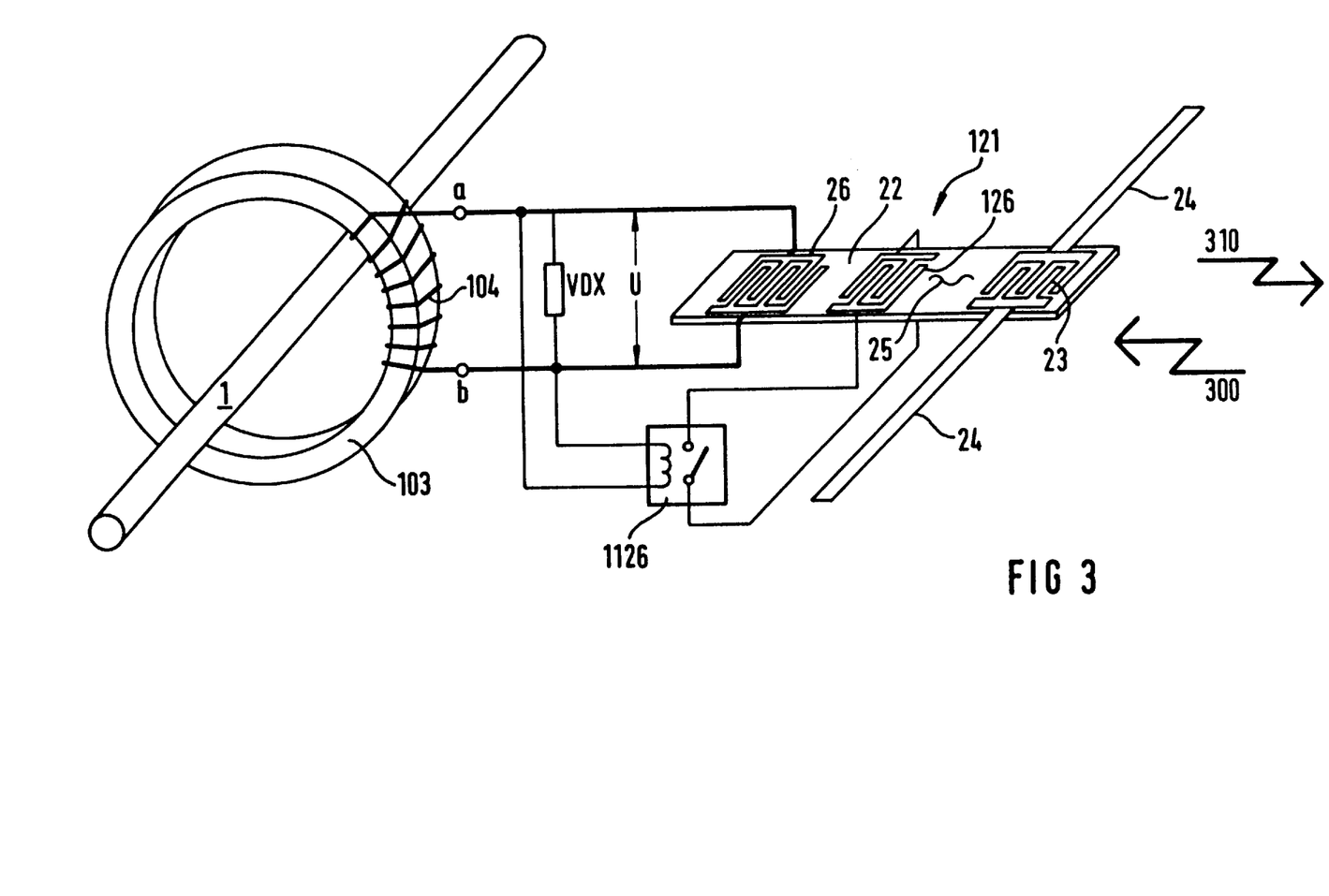
FIGS. 3 and 3a are fragmentary, perspective views of further examples of a current transformer according to the invention.

A further embodiment of a current transformer according to the invention, which can be provided on the basis of the invention, again makes it possible to determine current strength and current direction simultaneously. FIG. 3 shows such an embodiment, with a toroidal core 103 made of ferromagnetic material as is known from transformer converters, on which there is a toroidal-core winding 104. Two terminals a and b of this winding 104 are connected to a voltage-dependent impedance VDX connected in parallel with these terminals. In the sense of the invention, this voltage-dependent impedance and the winding 104 together form a magnetosensitive element which constitutes the terminating impedance to be connected to the surface-wave transducer in question (as is provided in the embodiments of FIGS. 1 and 2). A surface-wave configuration 121 of the embodiment illustrated in FIG. 3 again has the input/output transducer 23 with the antenna 24 connected thereto. In order to detect the current direction of the current to be measured, which flows in the high-voltage line 1, a further transducer 126 of the surface-wave configuration 121 is provided and is connected to a switch 1126. This switch 1126 is closed or opened, that is to say the transducer 126 is open-circuited or short-circuited, depending on the sign/direction of the electrical voltage across the impedance VDX. The surface-wave configuration 121 therefore makes it possible, on the basis of the acoustic wave transmitted by the transducer 23 and subsequently received thereby, to determine the magnitude of the electric current instantaneously flowing in the conductor 1 on the basis of the reflecting power of the transducer 26, which depends on the instantaneous value of the impedance VDX, and to determine its magnitude and direction on the basis of the effect on the propagation time with the transducer 126 opened or closed.

Figure 3A:
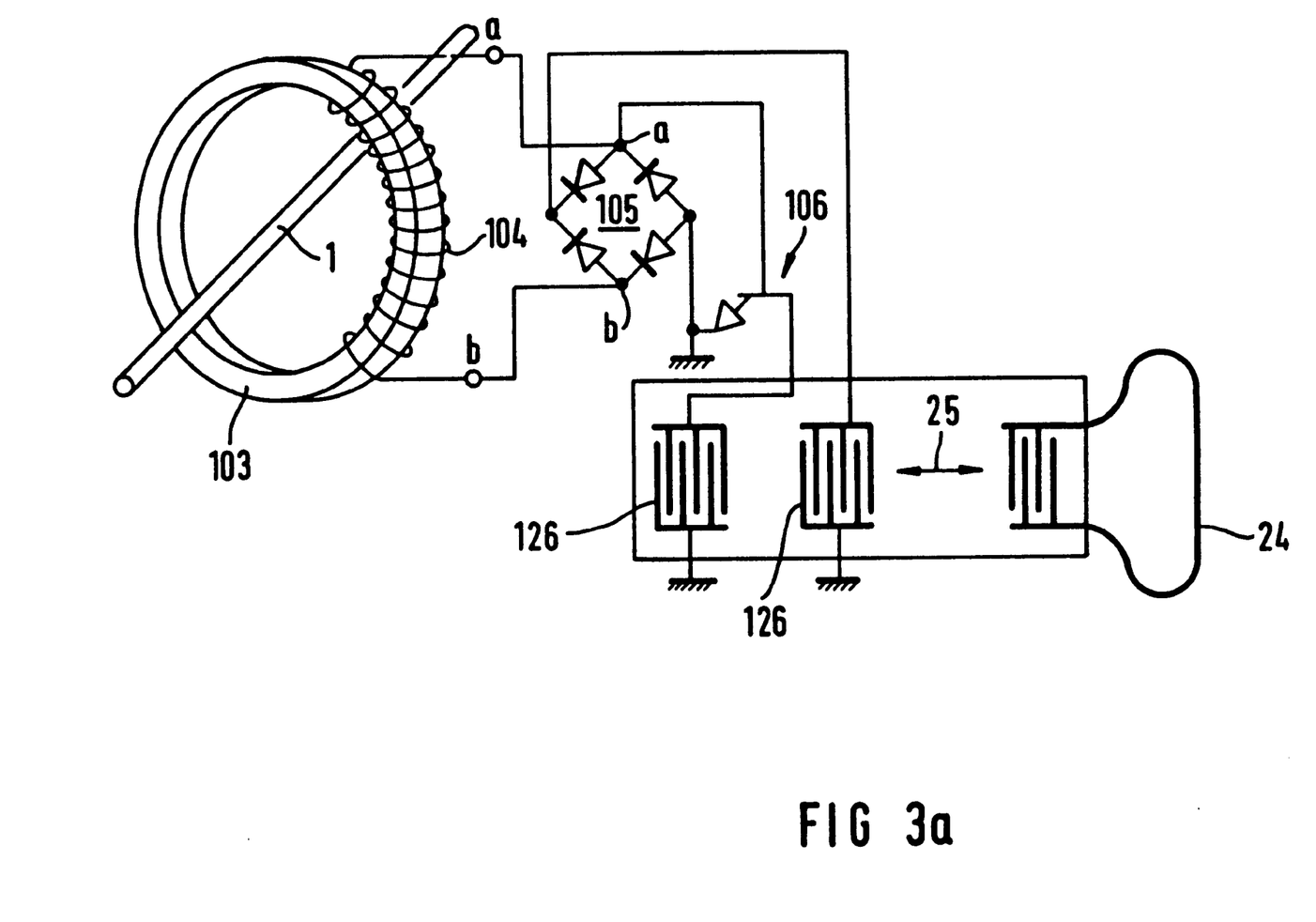

FIG. 3a shows an additional development of FIG. 3 for determining the magnitude and direction of the current. Reference numeral 105 denotes a bridge rectifier circuit and reference numeral 106 denotes a transistor. As can be seen from FIG. 3a, the further transducer 126 and an additional transducer 126 are connected to the circuit 105/106. The circuit 105 delivers the instantaneous magnitude of the instantaneously measured current and the transistor 106, which acts as a switch, delivers its sign.

Figure 4:
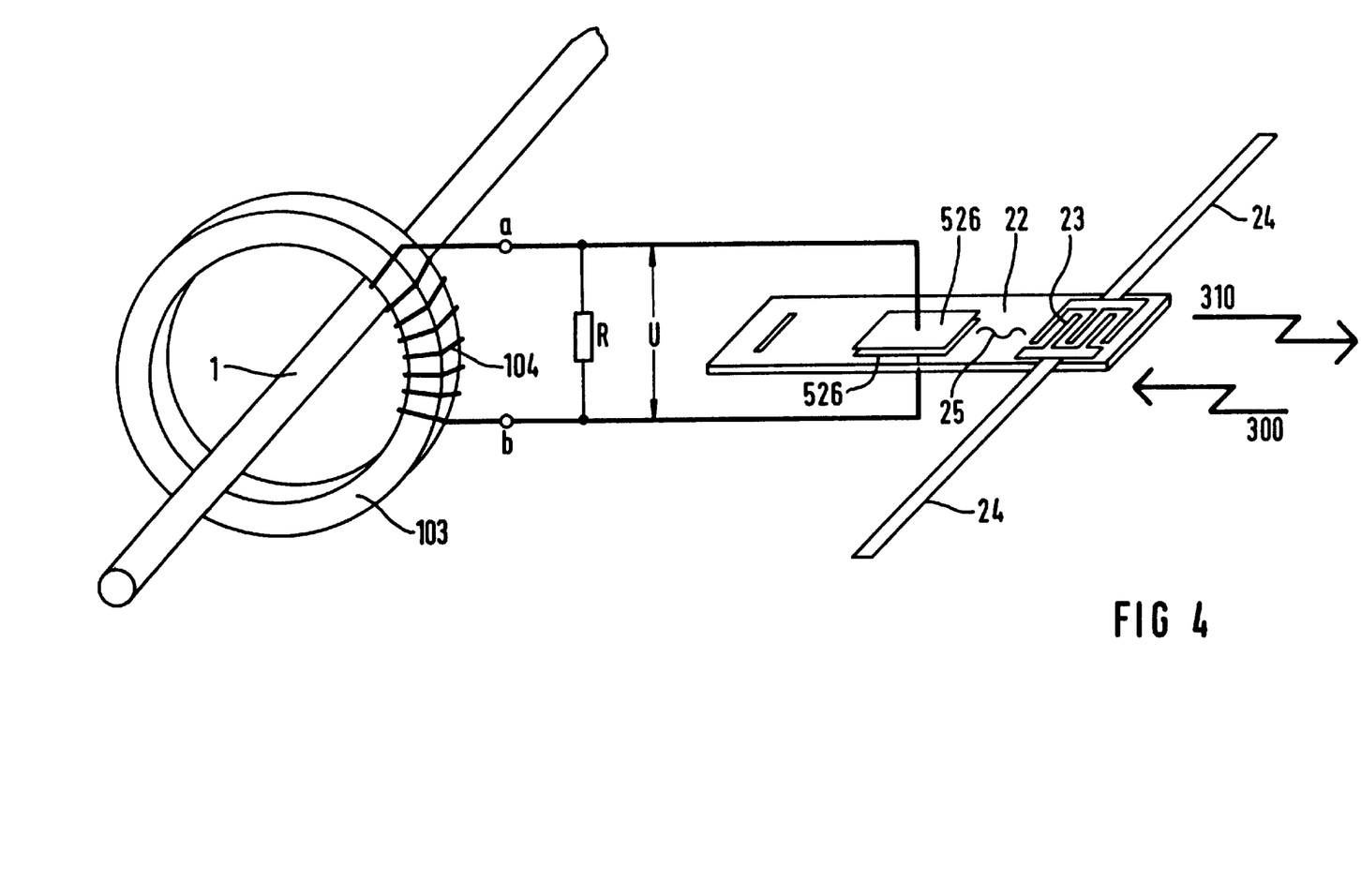
FIG. 4 is a fragmentary, perspective view of a particular development of a current transformer of the example in FIG. 3.

FIG. 4 shows an embodiment in which, in comparison with FIG. 3, the impedance VDX (and the switching circuit) has been omitted and the magnetic-field dependent voltage of the coil 104 is applied directly to an electrode pair 526, through the use of which an electrostriction is produced in the piezoelectric material in the body or substrate 22 of the surface-wave configuration in the region of the propagation path of the acoustic wave 25. This striction, in dependence on the respective amplitude of the applied voltage, causes a sensor effect which is an influence on the propagation time of the surface-wave configuration and the influence is dependent on this striction.

Figure 5:
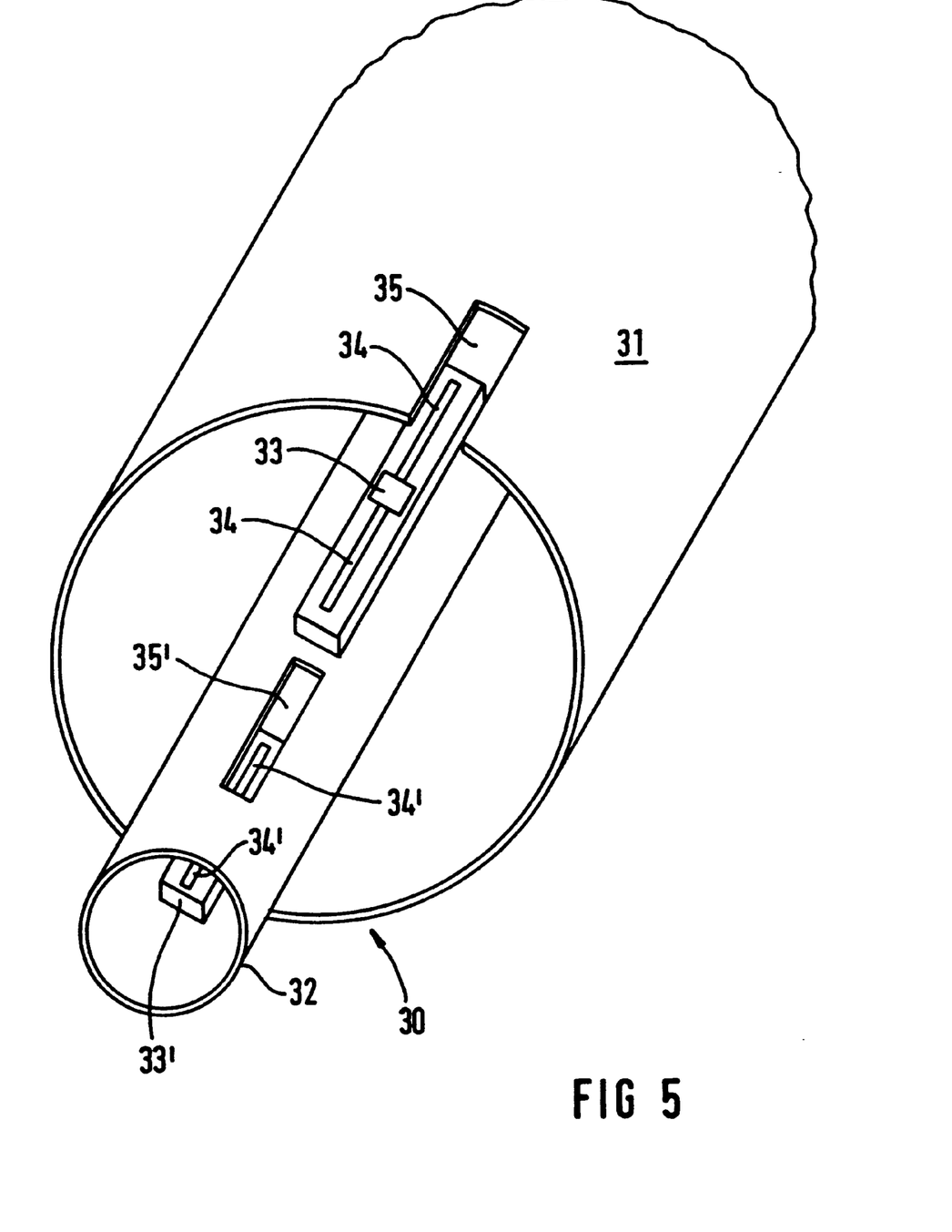
FIG. 5 is a fragmentary, perspective view of an example of a current transformer according to the invention in a power cable.

FIG. 5 shows an embodiment according to the invention to be applied in the case of a high-voltage cable. Reference numeral 31 denotes an outer conductor and reference numeral 32 denotes a coaxially disposed inner conductor of the cable 30. An insulator, for example $SF_6$, is contained in a space between the inner conductor and the outer conductor. A current transformer according to the invention, with its magnetosensitive element and its surface-wave configuration, is fitted as a transformer 33 on the surface of the inner conductor or, as an alternative (in order to avoid possible arcing), as a transformer 33' internally on the wall of the inner conductor 32. FIG. 5 shows only an outline diagram of the surface-wave configuration 33 with dipole halves of an antenna 34. In order to make it possible to carry out radio interrogation, a respective slot 35, 35' is provided in the outer conductor 31 and optionally in the inner conductor 32 of the cable as well, in order for the radio field to penetrate into the interior of the cable. In view of the gas filling, such a slot should be correspondingly sealed in a gas-tight manner with dielectric material. As an alternative, the interrogation signal can also be supplied in the form of a waveguide mode capable of propagating in the intermediate space of the tubular conductor between the inner conductor and the outer conductor. In this case this waveguide mode can also be excited at a remote location in the hollow conductor. It is possible to visualize the outer conductor 31 cut away and the surface of the inner conductor 32 having the current transformer 33 fitted thereon.

As is already shown in FIG. 1, the magnetosensitive element, which is represented in FIG. 1 as a meander-shaped magnetic-field sensitive resistor, may be disposed integrally on the body or substrate wafer 22 of the respective surface-wave configuration being used. Instead of such a meander-shaped resistor, the magnetosensitive element may also be a two-dimensionally extended element.

The surface-wave configuration may also be integrated into the impedance-producing sensor in a hybrid manner as an additional surface-wave chip. It may (also) be advantageous to provide the substrate for the surface-wave configuration as a piezoelectric layer, for example made of zinc oxide, which is fitted on a support substrate of the sensitive element. The element may, for example, be a semiconductor element on or in a silicon substrate.

Such a hybrid configuration may, in particular, be provided for assembly reasons, as well as for reasons of reduced sensitivity to interference.

Figure 6:
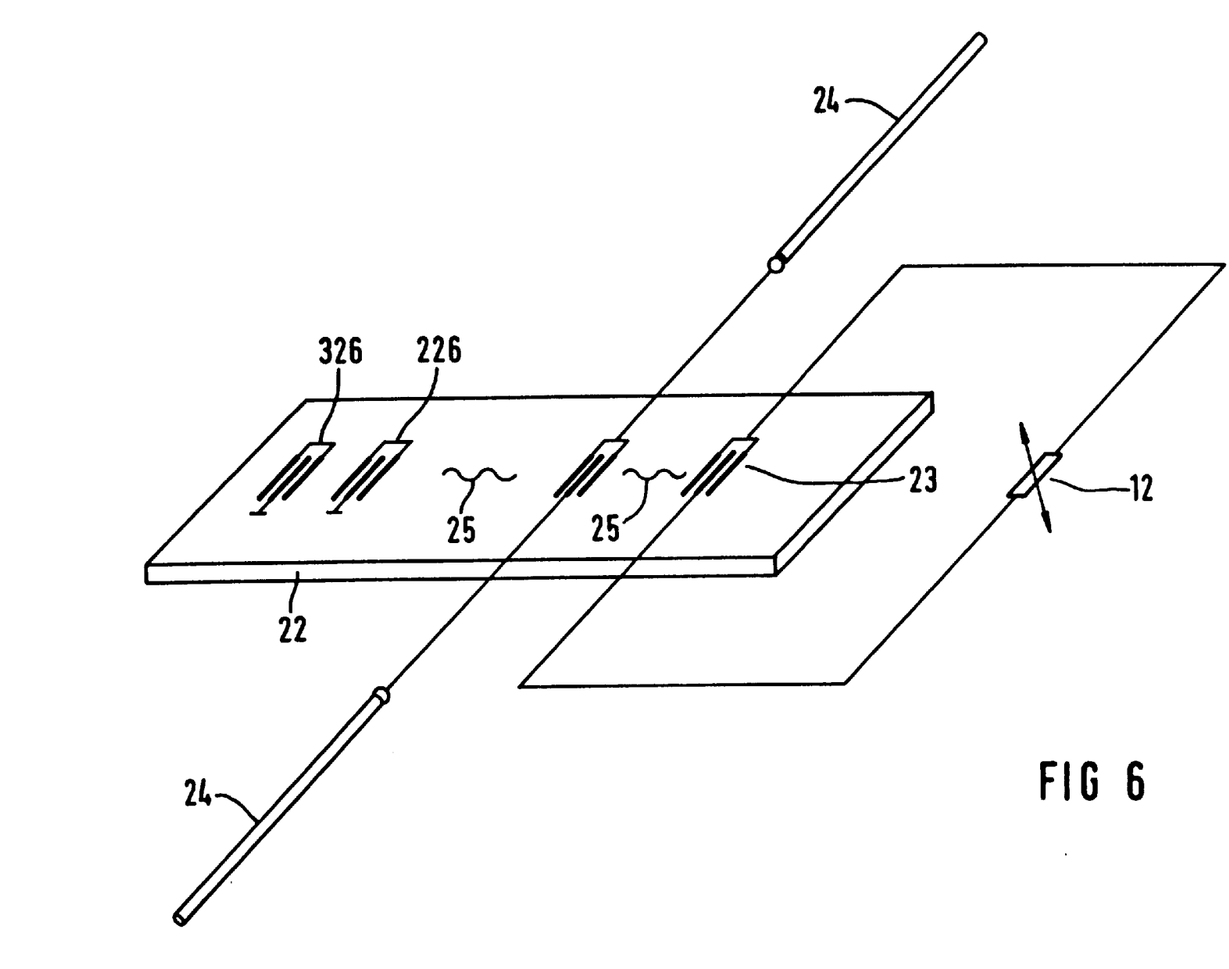
FIGS. 6, 7 and 8 are perspective views of special embodiments of a surface-wave configuration for a current transformer according to the invention.

Further improvements with regard to the signal evaluation can be achieved with especially advantageously configured surface-wave configurations. FIG. 6 shows a surface-wave configuration which once more has a substrate wafer 22 and surface-wave structures existing thereon. Reference numeral 23 again denotes the input/output transducer to which the dipole halves of the antenna 24 for radio reception and radio retransmission are connected. The transducer 26, which is connected to the magnetosensitive element 12 and serves as a surface-wave reflector, is disposed on the wafer 22 on one side of the transducer 23. In FIG. 6 two reference reflectors 226 and 326 are provided on the other side of the transducer 23 on the surface of the wafer 22. In addition to the current measurement, the reference reflectors 226 and 326 are also used to determine the distance between the transmitter/receiver and the sensor element 12 of the current transformer as well as the temperature of the sensor element. In the case of high-voltage lines which sway in the wind, the separation between that part of the current transformer according to the invention which is connected to the line and that part thereof which is constructed as a ground station changes continuously, as is known. The basis for the distance measurement and the temperature measurement in this case is that the actual sensor element 12 is likewise located on the wafer or is positioned at a defined small distance therefrom. In the determination of the distance (changes) and the temperature of the sensor element, it is possible, for example, to eliminate possible known transverse sensitivities of the sensor signal in the signal processing.

Figure 7:
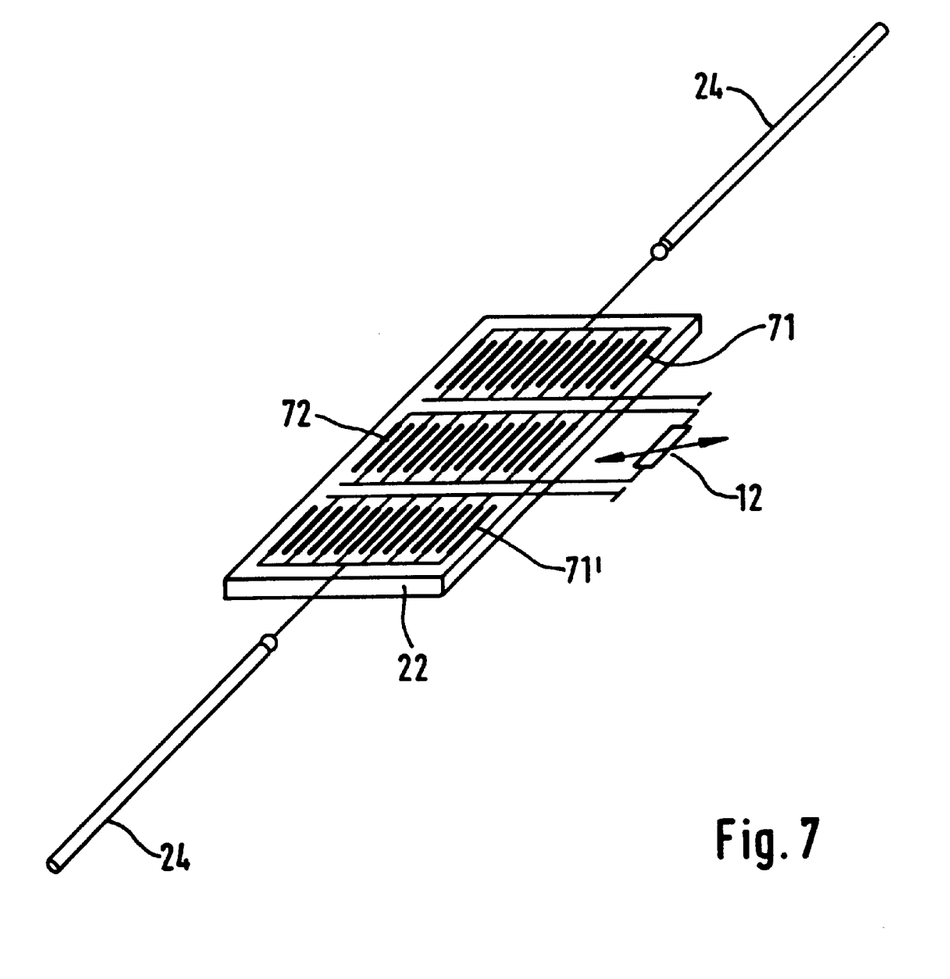
Figure 8:
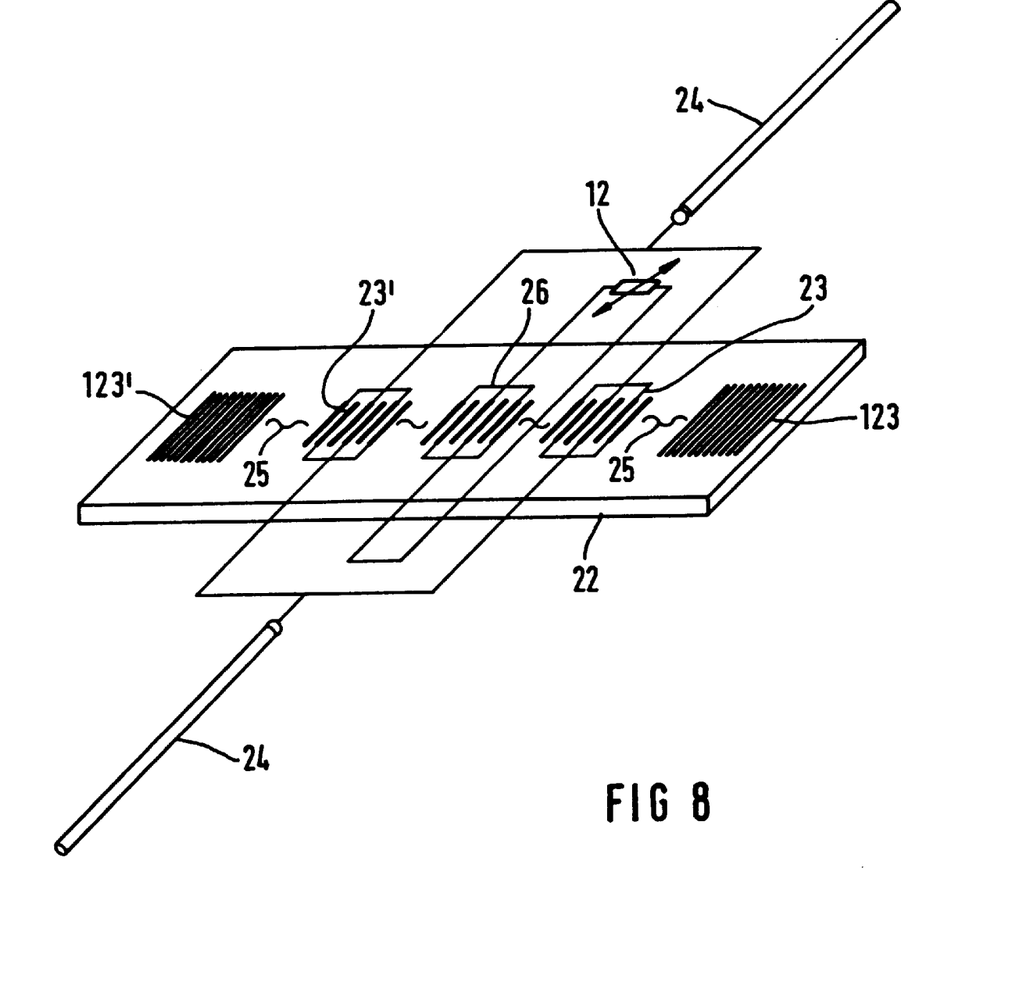

FIGS. 7 and 8 show further surface-wave configurations which are suitable for the signal evaluation. FIG. 7 shows a configuration with mode-coupled transducers. The transducers, which are denoted by reference numerals 71 and 71' and are disposed on the substrate wafer 22, are input/output transducers with their dipole halves of the antenna 24. A transducer 72 is likewise a surface-wave structure which is mode-coupled to the transducers 71, 71'. This mode-coupled transducer 72 is connected to the magnetosensitive element 12 and the change in its terminating impedance, that is to say the change of the element 12 in the magnetic field, is the measured quantity to be evaluated, as in the above-described examples.

FIG. 8 shows a surface-wave resonator configuration. This configuration includes input/output transducers 23, 23' on the substrate 22 and a transducer 26 which is connected to the magnetosensitive element as before. Reference numerals 123 and 123' denote reflector structures at which the acoustic wave propagating in the substrate surface is reflected back on itself, so that these reflectors have the effect of mirrors of a resonator.

A current transformer according to the invention is gauged/calibrated in a manner which is known per se, as is employed in many cases for gauging sensors/measuring instruments that output quantitative measurements.

When selecting the magnetosensitive material/element, it is advantageous to provide one with a high Curie temperature which is considerably higher than the maximum operating temperature of the sensor element. A magnetoresistor, a (giant) magnetoresistive layer, a (giant) magnetostrictive layer and the like are suitable as the magnetosensitive material/element.

Amorphous glasses such as, for example, $Fe_{40}Ni_{38}Mo_4B_{18}$, which have outstanding soft magnetic properties and at the same time good mechanical properties, as well as terfenol are in particular also suitable as magnetostrictive coating material for the substrate body of the surface-wave configuration.

Figure 9:
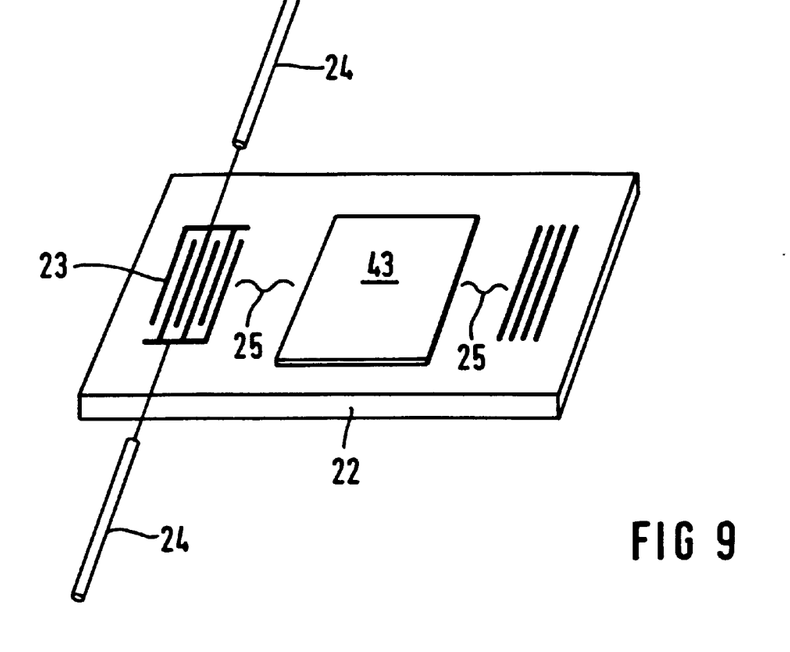
FIGS. 9 and 10 are perspective views of embodiments of a current transformer according to the invention, which has a magnetostrictive layer/support plate as a magnetosensitive element.

FIG. 9 shows a surface-wave configuration with the magnetostrictive coating already mentioned above. The substrate body, again denoted by reference numeral 22, of the surface-wave configuration, is coated with a layer 43 of the above-mentioned iron/nickel/molybdenum/boron glass, for example. In the magnetic field in the gap 5 of the soft-magnetic iron ring 3, the layer 43 of the surface-wave configuration positioned therein experiences a magnetostrictive effect which leads to changes in the propagation time in the region of this layer 43 for the surface wave of the surface-wave configuration. This change in propagation time is the measured quantity which makes it possible to determine the instantaneous current strength on the basis of the instantaneous value of the magnetic field. Otherwise, a current transformer according to the invention operates as has already been explained for the above described surface-wave configurations and their signal evaluation.

Figure 10:
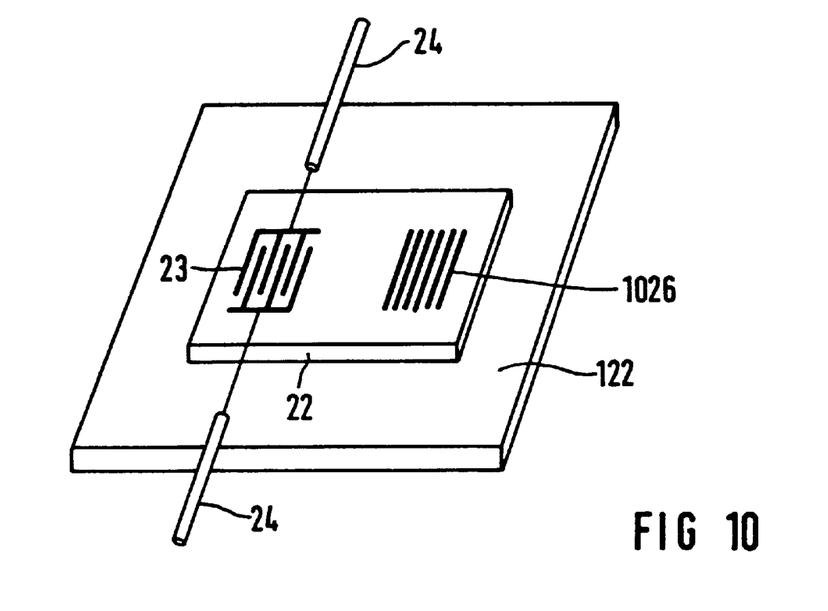

FIG. 10 shows a development, again employing a magnetostrictive effect, of a current transformer according to the invention. In this case, the relatively thin substrate wafer 22 of the surface-wave configuration is located on a comparatively equally thick or thicker magnetostrictive support plate 122. If this magnetostrictive support plate 22 is located in the active region of the magnetic field 5 of FIGS. 1 and 2 in accordance with an application of the current transformer according to the invention, then the material of this support plate 122 experiences a change in geometrical dimensions, in particular a magnetic-field dependent contraction/extension. Such a length change causes the substrate plate 22 to be exposed to mechanical stress loading, which again leads to changes in the propagation time of the surface wave between the input/output transducers 23 and a reflector structure 1026 of the actual surface-wave configuration. This change in propagation time may also be employed as a measured quantity for the electric current strength in the high-voltage line which is to be measured.

The interrogation and evaluation unit of a current transformer according to the invention includes a local transmission oscillator, the transmitted signals of which are fed and switch-controlled through an end stage and a transmission/reception filter, to the antenna of the ground station. From this antenna, the signal is radio-transmitted to the antenna 24, 34 which was already mentioned several times. This ground-base antenna also receives the response signal from the antenna of the surface-wave configuration. This received signal is fed through an amplifier and a mixer which is controlled by the transmission oscillator. The response signal, converted into the intermediate-frequency range, is filtered by a band-pass filter and amplified. In order to make it possible to evaluate the signal digitally, it is digitized in an analog-to-digital converter and can be processed in a microcomputer.

The response signal of the surface-wave configuration, which is to be received by the receiver of the evaluation unit and is influenced by the magnetic field of the current that instantaneously flows in the high-voltage line and is to be measured with regard to current strength and phase is a reflected exponentially decaying natural oscillation, in the case of a resonator configuration. The frequency, phase and decay-time constant of this exponentially decaying natural oscillation contain the information regarding the magnetic field acting in the magnetosensitive element of the sensor part of the device according to the invention. If the surface-wave configuration is a delay line, that is to say, for example, a reflective delay line, then the response signal of the surface-wave configuration contains characteristic echoes of the interrogation signal. The respective frequency relationship, relative amplitude, different propagation times and/or phase angles of this echo contain the information. If the surface-wave configuration includes one or more dispersive (chirped) structures, then the interrogation signal experiences one or more frequency modulations before it is transmitted back by the actual current transformer. The precise type of this modulation contains the information.

We claim:

1. A current transformer for current strength measurement on/in electrical devices at high voltage, comprising:
   a surface-wave configuration having surface-wave structures and an antenna;
   a magnetosensitive element coupled to at least one of said surface-wave structures; and
   a radiofrequency transmitter and receiver having a radio antenna and an electronic evaluation device, said transmitter constructed for radio transmission of an interrogation pulse and said receiver with said evaluation device constructed for radio reception and for evaluation of a change influenced by an instantaneous magnetic field in a high-voltage device, the change occurring in an impulse response of said surface-wave configuration.

2. The current transformer according to claim 1, wherein said magnetosensitive element is a magnetoresistive element electrically connected to one of said surface-wave structures.

3. The current transformer according to claim 2, wherein said magnetoresistive element is a magnetic-field dependent resistor.

4. The current transformer according to claim 2, wherein said magnetoresistive element is a bismuth spiral.

5. The current transformer according to claim 1, including a transformer toroidal core winding, said surface-wave structures including first and second surface-wave structures, said magnetosensitive element having a voltage-dependent impedance and a switching device electrically connected to said transformer toroidal core winding, said voltage-dependent impedance electrically connected to said first surface-wave structure and said switching device electrically connected to said second surface-wave structure as respective electrical terminations of said surface-wave structures.

6. The current transformer according to claim 1, including a transformer toroidal core winding, said surface-wave structures including first and second surface-wave structures, said magnetosensitive element having a rectifier bridge circuit and a switching device electrically connected to said transformer toroidal core winding, said rectifier bridge circuit electrically connected to said first surface-wave configuration and said switching device electrically connected to said second surface-wave structure as respective electrical terminations of said surface-wave structures.

7. The current transformer according to claim 1, wherein said surface-wave configuration has a substrate, and said magnetosensitive element is a magnetostrictive element disposed on/at said substrate.

8. The current transformer according to claim 7, wherein said magnetostrictive element is a layer disposed on said substrate.

9. The current transformer according to claim 7, wherein said magnetostrictive element is a support plate forming a magnetosensitive striction-flexion element rigidly connected to said substrate.

10. The current transformer according to claim 7, including a piezoelectric layer for said surface-wave configuration disposed on a magnetostrictive substrate material.

11. The current transformer according to claim 1, wherein said surface-wave configuration is a surface-wave resonator filter.

12. The current transformer according to claim 1, wherein said surface-wave configuration is a mode-coupled configuration.

13. The current transformer according to claim 1, wherein said surface-wave configuration is a delay line.

14. The current transformer according to claim 1, including a device having a DC magnetic field superposed with a magnetic field of a current to be measured, for shifting an operating point.

15. A current transformer assembly for current strength measurement on/in electrical devices at high voltage, comprising:
   two current-transformers each including:
      a surface-wave configuration having surface-wave structures and an antenna;
      a magnetosensitive element coupled to at least one of said surface-wave structures;
      a radiofrequency transmitter and receiver having a radio antenna and an electronic evaluation device, said transmitter constructed for radio transmission of an interrogation pulse and said receiver with said evaluation device constructed for radio reception and for evaluation of a change influenced by an instantaneous magnetic field in a high-voltage device, the change occurring in an impulse response of said surface-wave configuration; and
      a device with a DC magnetic field superposed with a magnetic field of a current to be measured; the DC magnetic field of one of said current-transformer devices having an opposite polarity to the DC magnetic field of the other of said current-transformer devices, relative to the magnetic field to be measured, for shifting an operating point in respectively mutually opposite directions.

16. A current transformer assembly for current strength measurement on/in electrical devices at high voltage, comprising:
   a high-voltage/medium-voltage cable; and
   current-transformer disposed in said cable, said current-transformer including:
      a surface-wave configuration having surface-wave structures and an antenna;
      a magnetosensitive element coupled to at least one of said surface-wave structures; and
      a radiofrequency transmitter and receiver having a radio antenna and an electronic evaluation device, said transmitter constructed for radio transmission of an interrogation pulse and said receiver with said evaluation device constructed for radio reception and for evaluation of a change influenced by an instantaneous magnetic field in a high-voltage device, the change occurring in an impulse response of said surface-wave configuration.

17. The current transformer assembly according to claim 16, wherein said cable is a coaxial cable having a coaxial conductor and a slot formed in said coaxial conductor for input/output coupling of a radio signal.

18. The current transformer according to claim 17, wherein the radio signal is input/output through a waveguide mode propagating in a hollow conductor of said cable.

* * * * *